(12) United States Patent
Shi et al.

(10) Patent No.: US 8,592,291 B2
(45) Date of Patent: Nov. 26, 2013

(54) FABRICATION OF LARGE-AREA HEXAGONAL BORON NITRIDE THIN FILMS

(75) Inventors: Yumeng Shi, Cambridge, MA (US); Jing Kong, Winchester, MA (US); Christoph Hamsen, Hamm (DE); Lain-Jong Li, Hsinchu (TW)

(73) Assignee: Massachusetts Institute of Technology, Cambridge, MA (US)

( * ) Notice: Subject to any disclaimer, the term of this patent is extended or adjusted under 35 U.S.C. 154(b) by 270 days.

(21) Appl. No.: 13/081,762

(22) Filed: Apr. 7, 2011

(65) Prior Publication Data

US 2011/0256386 A1    Oct. 20, 2011

Related U.S. Application Data

(60) Provisional application No. 61/321,710, filed on Apr. 7, 2010.

(51) Int. Cl.
*H01L 21/205* (2006.01)

(52) U.S. Cl.
USPC .............. 438/492; 257/E21.17; 257/E21.567; 257/E21.568; 257/E21.6; 438/455; 438/584; 438/680

(58) Field of Classification Search
USPC ......... 257/E21.17, E21.567, E21.568, E21.6; 438/455, 492, 584, 680
See application file for complete search history.

(56) References Cited

U.S. PATENT DOCUMENTS

| 3,321,337 A | 5/1967 | Patterson et al. |
| 5,079,038 A | 1/1992 | Rye et al. |
| 2004/0058199 A1 | 3/2004 | Sakamoto et al. |
| 2004/0110395 A1* | 6/2004 | Ueda et al. ............. 438/795 |
| 2006/0286814 A1 | 12/2006 | Kumada et al. |
| 2008/0038585 A1 | 2/2008 | Kumada et al. |
| 2008/0135162 A1* | 6/2008 | Sakashita ............. 156/235 |
| 2010/0021708 A1 | 1/2010 | Kong et al. |
| 2011/0163298 A1* | 7/2011 | Sung ............. 257/29 |
| 2012/0015166 A1* | 1/2012 | Kelber ............. 428/215 |

FOREIGN PATENT DOCUMENTS

JP      63145778    6/1988

OTHER PUBLICATIONS

Ping Loh, Kian, et al., "Surface conditioning of chemical vapor deposited hexagonal boron nitride film for negative electron affinity", Applied Physics Letters, vol. 74, No. 1 (Jan. 4, 1999), pp. 1-3.

Choi, Byung-Jin, "Chemical vapor deposition of hexagonal boron nitride films in the reduced pressure", Materials Research Bulletin, vol. 34, No. 14-15 (1999), pp. 2215-2220.

Özdemir, Orhan, et al., "Annealing improvement on the localized states of plasma grown boron nitride film assessed through admittance measurements", Journal of Alloys and Compounds, vol. 475, No. 1-2 (May 5, 2009), pp. 794-803.

(Continued)

*Primary Examiner* — Asok K Sarkar
(74) *Attorney, Agent, or Firm* — Modern Times Legal; Robert J. Sayre

(57) ABSTRACT

A hexagonal boron nitride thin film is grown on a metal surface of a growth substrate and then annealed. The hexagonal boron nitride thin film is coated with a protective support layer and released from the metal surface. The boron nitride thin film together with the protective support layer can then be transferred to any of a variety of arbitrary substrates.

20 Claims, 6 Drawing Sheets

(56) References Cited

OTHER PUBLICATIONS

European Patent Office, "International Search Report and Written Opinion", Application No. PCT/US2011/031544 (PCT application corresponding to this US application) (Jul. 1, 2011), pp. 1-14.

Nippon Sanso KK, English-language abstract for the Japanese patent document, JP 63145778, Patent Abstracts of Japan (Jun. 17, 1988).

Chan, V. Z., et al., "Characterization of boron nitride thin films prepared from a polymer precursor", Journal of Materials Research, vol. 11, No. 2 (Feb. 1, 1996), pp. 1-8.

Fazen, Paul J., et al., "Synthesis, Properties, and Ceramic Conversion Reactions of Polyborazylene. A High-Yield Polymeric Precursor to Boron Nitride", Chem. Mater., vol. 7, No. 10, (1995), pp. 1942-1956.

Nagashima, A., et al., "Electronic dispersion relations of monolayer hexagonal boron nitride formed on the Ni(111) surface", Physical Review B, vol. 51 No. 7 (Feb. 15, 1995), pp. 4606-4613.

Oshima, C., et al., "A Heteroepitaxial Multi-Atomic-Layer System of Graphene and h-BN", Surface Review and Letters, vol. 7, Nos. 5 & 6 (Jul. 7, 2000), pp. 521-525.

Watanabe, Kenji, et al., "Direct-bandgap properties and evidence for ultraviolet lasing of hexagonal boron nitride single crystal", Nature Materials, vol. 3 (May 23, 2004), pp. 404-409.

Watanabe, Kenji, et al., "Far-ultraviolet plane-emission handheld device based on hexagonal boron nitride", Nature Photonics, vol. 3 (Sep. 20, 2009), pp. 591-594.

Watanabe, Kenji, et al., "Ultraviolet luminescence spectra of boron nitride single crystals grown under high pressure and high temperature", Phys. Stat. Sol., vol. 201, Issue 11 (Sep. 7, 2004), pp. 2561-2565.

* cited by examiner

FABRICATION OF LARGE-AREA HEXAGONAL BORON NITRIDE THIN FILMS

RELATED APPLICATION

This application claims the benefit of U.S. Provisional Application No. 61/321,710, filed 7 Apr. 2010, the entire content of which is incorporated herein by reference.

GOVERNMENT SUPPORT

This invention was made with government support under Grant No. DMR0845358 awarded by the National Science Foundation. The government has certain rights in this invention.

BACKGROUND

Boron nitride (BN) is isoelectronic to a similarly structured carbon lattice while including an equal number of boron and nitrogen atoms. Like carbon material, BN exists in various crystalline forms, such as amorphous (a-BN), hexagonal (h-BN), cubic (c-BN) and wurtzite (w-BN). Among all these different crystalline forms, the hexagonal form is the most stable one. Similar to graphite, the boron and nitrogen atoms in each layer of h-BN are bound together by strong covalent bonds, forming the hexagonal BN sheet, while between layers, bonding is via the weak van der Waals force.

Based on their unique two-dimensional planar structure, h-BN thin films have a wide range of attractive properties, including high-temperature stability, low dielectric constant, high strength, large thermal conductivity, high hardness and high corrosion resistance. The decomposition temperatures of h-BN are up to 1000° C. in air and 2800° C. in an inert atmosphere. h-BN, therefore, is a good lubricant even at extremely high temperatures. Compared to graphite, h-BN is also more useful when electrical insulation is required.

Besides its traditional usages, h-BN also has great potential in microelectronic devices and nanotechnology. Similar to aluminum nitride (AlN) and gallium nitride (GaN), h-BN is a wide-gap semiconductor with a band gap energy corresponding to the ultraviolet (UV) region (around 6 eV). Furthermore, h-BN is more chemically and thermally stable than AlN and GaN, making h-BN one of the most promising materials for UV optical devices, even working in extreme environments. When voltage is applied to h-BN, it can emit UV light in the range 215-250 nm and can therefore potentially be used as a light emitting diode (LED) or as a UV-laser. Boron nitride can also be p-doped by beryllium or n-doped by sulfur. H-BN, accordingly, has the potential to perform as a p-n junction device. Due to its excellent dielectric properties, h-BN can also be used in electronics, for example, as a substrate for semiconductors and microwave-transparent windows. h-BN is also used as a charge-leakage barrier layer of the photo drum in laser printers.

Although with such significant advantages and wide applications for h-BN, methods for obtaining h-BN, especially an h-BN thin film with an atomic smooth surface, are very limited. Chemical vapor deposition (CVD) has been used to obtain h-BN thin film for electronic applications, wherein various chemical systems, such as $BCl_3/NH_3$ and $B_2H_6/NH_3$, have been employed for h-BN synthesis. Controlling the surface morphologies and B/N stoichiometries, however, is very challenging. Borazine ($B_3N_3H_6$) is a good precursor for h-BN synthesis due to the 1:1 B/N stoichiometry. Monolayer h-BN thin film can be obtained by exposure of borazine to nickel (111) or to another transition metal surface, but the known method uses an ultrahigh-vacuum chamber with a high-temperature growth condition. Additionally, growth of more than one layer of h-BN via this method is far more difficult; therefore, a technique for growing h-BN thin film in a controlled manner is highly demanded.

Additional discussion relating to boron nitride is provided in the following references: U.S. Pat. No. 5,079,038; U.S. Pat. No. 3,321,337; US Published Application No. 2008/0038585 A1; US Published Application No. 2006/0286814 A1; US Published Application No. 2010/0021708 A1; P. Fazen, et al., "Synthesis, Properties, and Ceramic Conversion Reactions of Polyborazylene, A High-Yield Polymeric Precursor to Boron Nitride," 7 Chem. Mater. 1942-1956 (1995); C. Oshima, et al., "A Heteroepitaxial Multi-Atomic-Layer System of Graphene and h-BN," 7 Surface Review and Letters 521-525 (2000); A. Nagashima, et al., "Electronic Dispersion Relations of Monolayer Hexagonal Boron Nitride Formed on the Ni(111) Surface," 51 Physical Review B 4606-4613 (1995); K. Watanabe, et al., "Far-Ultraviolet Plane-Emission Handheld Device Based on Hexagonal Boron Nitride," 3 Nature Photonics 591-594 (20 Sep. 2009); K. Watanabe, et al., "Ultraviolet Luminescence Spectra of Boron Nitride Single Crystals Grown under High Pressure and High Temperature," 201 Phys. Stat. Sol. (a) 2561-2565 (2004); K. Watanabe, et al. "Direct-bandgap properties and evidence for ultraviolet lasing of hexagonal boron nitride single crystal," 3 Nature Materials 404-409 (2004).

SUMMARY

Methods for the production of a hexagonal boron nitride (h-BN) thin film and the resulting thin films are described herein. Various embodiments of the product and method may include some or all of the elements, features and steps described below.

A large-area h-BN thin film with an atomic smooth surface can be fabricated on a metal surface, such as a polycrystalline Ni(111) surface. Borazine can be used as the precursor for the h-BN and can be applied via ambient-pressure chemical vapor deposition (APCVD). The h-BN film can be grown at temperature down to about 400° C., followed by high-temperature annealing at about 1000° C. for better h-BN crystalline structure. The thickness of h-BN film depends on growth time and the flow rate of precursor.

The h-BN thin film is coated with a protective support layer, and the metal surface can then be etched away to release the h-BN thin film and the protective support layer to which it is bound. The h-BN thin film and the protective support layer can then be deposited on an arbitrary substrate (i.e., any of a wide variety of substrates other than the substrate on which it was grown), and the protective support layer can then be removed.

Large-area, high-quality h-BN thin films can be obtained via this method, which are particularly advantageous for use in large-scale electronic applications. Some of the applications in which the h-BN films can be used include the following: as dielectric layers in devices; as ultrathin insulating layers; as transistor devices both for DC and for high frequency; as optical detectors; as on-chip capacitors or insulators for integrated circuits; as hetero-junction devices (metal-semiconductor) along different crystal orientations; as an in-plane thermal conductor to spread the heat-dissipation area; as p-n junction diodes or bi-polar junction transistors; as devices with adjustable bandgap; as an interface between different materials, such as Si, GaN and GaAs, etc., to obtain a hetero-material device; for lasing or luminescence; as a transparent film for UV-LED, photo-detector applications; and as a lubricant.

Figure 1:
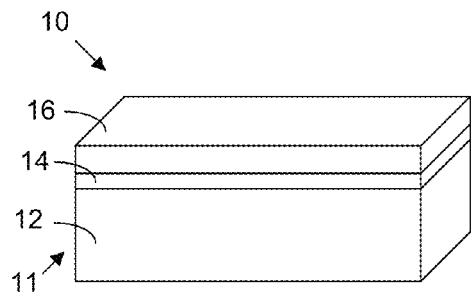
FIG. 1 is an illustration of a growth substrate.

In the accompanying drawings, like reference characters refer to the same or similar parts throughout the different views. The drawings are not necessarily to scale and the relative thicknesses of the illustrate layers are not fully accurately represented, emphasis instead being placed upon illustrating particular principles, discussed below.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2% by weight or volume) can be understood as being within the scope of the description; likewise, if a particular shape is referenced, the shape is intended to include imperfect variations from ideal shapes, e.g., due to machining tolerances.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "upper," "beneath," "below," "lower," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to" or "coupled to" another element, it may be directly on, connected or coupled to the other element or intervening elements may be present unless otherwise specified.

The terminology used herein is for the purpose of describing particular embodiments and is not intended to be limiting of exemplary embodiments. As used herein, the singular forms, "a," "an" and "the," are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

An h-BN thin film can be fabricated on a metal substrate or a metal-coated growth substrate 10. In particular examples, the substrate 11 underlying the metal film 16 is silicon 12 with a silica surface coating 14 ($Si/SiO_2$), as shown in FIG. 1. The silica coating 14 can be thermally grown. As an alternative to $Si/SiO_2$, the growth substrate can include $Al_2O_3$ or quartz or others. The metal film 16 can have a thickness of, for example, 100-500 nm and can be a single crystal or polycrystalline. Examples of the metal can be a transition metal, such as nickel, platinum, copper and/or ruthenium. A protective oxide layer (e.g., nickel oxide) can be formed on the surface of the metal film 16, and the oxide layer can be removed before h-BN formation by annealing the metal film 16 with $H_2$ as reduction gas.

In some embodiments, an intermediate layer can be formed between the metal layer 16 and the $Si/SiO_2$ substrate 11. For example, a 5-nm chromium layer can be deposited via evaporation or sputtering on the $Si/SiO_2$ substrate 11 before deposition of the metal layer 16; the chromium wets the silica 14 better and can prevent the subsequently deposited metal layer 16 from breaking up on the surface of the substrate 11. The metal layer 16 can be deposited either by electron-beam or thermal evaporation, sputtering, or simply electrochemical deposition. In another alternative embodiment, the entire substrate can be formed of a metal, such as nickel, without the underlying insulating substrate; in this embodiment, however, etching to free the h-BN film 18 may not be as readily limited to a thin surface layer (e.g., a thin nickel layer) beneath the h-BN film 18, resulting in a need for more acid and a longer etching process.

Figure 2:
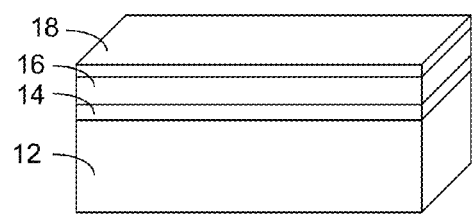
FIG. 2 is an illustration of a h-BN film grown on the growth substrate.

In particular embodiments, the h-BN film 18 is deposited, as shown in FIG. 2, via chemical vapor deposition (CVD) synthesis. The CVD process can be either at ambient pressure (APCVD) (e.g., at a pressure of between about 50 kPa and about 101 kPa at most locations on earth, depending on elevation) or at low pressure (LPCVD) on polycrystalline nickel-coated substrates. The h-BN film 18 is deposited/grown via a dehydrogenate reaction of borazine ($B_3N_3H_6$) on the exposed surface of the metal film 16. Borazine is a useful precursor for h-BN synthesis due to its 1:1 B/N stoichiometry. The h-BN film 18 is deposited and grown at a temperature in the range from 70° C. to 1000° C. In particular embodiments, the range is from 300° C. to 700° C.; and in a specific example, the deposition and growth temperature is about 400° C., which provides a favorable balance of reasonable growth rate, which may be sacrificed if the temperature is too low, and surface morphology controllability, which may be sacrificed if the temperature is too high. The h-BN film 18 can then be annealed under nitrogen and hydrogen at a temperature of 900-1100° C.

The area of the resulting h-BN film 18 can be 1-2 $cm^2$; and, in principle, there is no limitation on the size of the h-BN film 18 produced via these methods. The thickness of the h-BN thin film 18 can be, for example, 5 nm to 50 nm; and the h-BN film can be polycrystalline with an average single crystalline domain size of 0.5 $um^2$. The B/N atomic concentration can be 52.93% and 47.07%, respectively. From the absorption measurement, the optical band gap of this h-BN thin film 18 is estimated to be around 5.92 eV.

Figure 3:
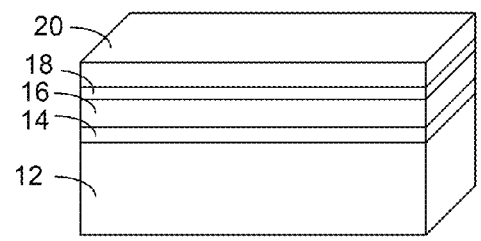
FIG. 3 is an illustration of a protective support layer coated on the h-BN film.
Figure 4:
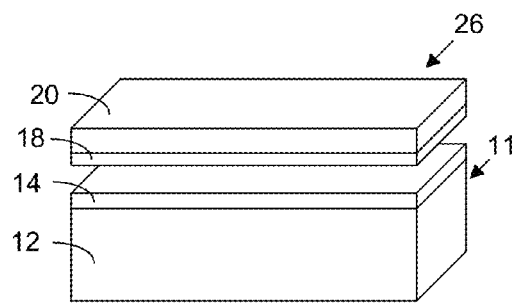
FIG. 4 is an illustration showing the release of the protective support layer and h-BN film from the growth substrate.

Next, the h-BN film 18 is coated with a protective support layer 20, as shown in FIG. 3. The protective support layer 20 can be formed, e.g., of a polymer, such as polymethylmethacrylate (PMMA), polydimethylsiloxane (PDMS), polyethylene terephthalate (PET), or polyethylene naphthalate (PEN). In this embodiment, the polymer is polymethylmethacrylate. The polymethylmethacrylate layer 20 is spin-coated on the h-BN film 18 by pouring, e.g., 50-100 microliters of polymethylmethacrylate on the h-BN-coated substrate and then spinning the substrate at 3000 revolutions per minute (rpm). The final thickness of the PMMA coating 20 can be set to, e.g., between 200 nm to 1.5 microns by controlling the number of iterations of the spin coating process, described above, the spinning speed or the concentration of the PMMA solution. A thicker coating of the polymethylmethacrylate layer 20 can lead to better manipulation of the bonded h-BN/polymethylmethacrylate laminate 26 after being released, as shown in FIG. 4.

The h-BN/PMMA laminate is released from the layered structure by etching the underlying nickel 26 with a mild aqueous hydrochloric acid (HCl) solution. The concentration of the HCl is, e.g., about 3 volume-% in water. The layered structure can be immersed in the HCl solution for around one hour to release the supported film 26 (i.e., the synthesized h-BN film layer 18 and the adhered polymethylmethacrylate 20) from the underlying growth substrate, as shown in FIG. 4. Other acidic solutions or any chemical known to etch nickel may be used for this purpose in place of the HCl solution.

Figure 5:
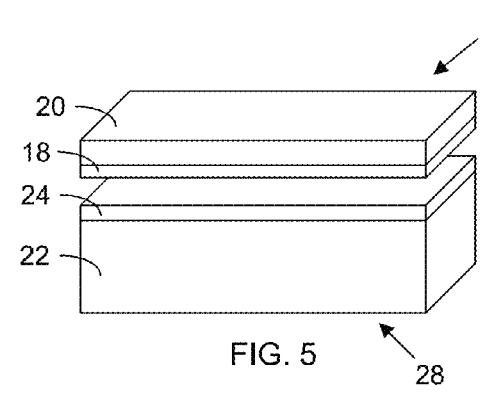
FIG. 5 is an illustration showing the protective support layer and h-BN film being deposited on a target substrate.

Subsequently, the supported film 26 can be transferred to any substrate for analysis and characterization. In one embodiment, once the supported film 26 is released, the supported film 26 is moved to a beaker with water, where the supported film 26 will be floating at the water/air interface with the h-BN side 18 facing down. Next, the (arbitrary) target substrate 28 [in this case, silicon 22 coated with a silica ($SiO_2$) layer 24] is immersed in the water and is moved upwards from the configuration shown in FIG. 5 so that the target substrate 28 "picks up" the supported film 26 on the water surface, thereby producing a target-substrate/h-BN/polymethylmethacrylate arrangement. When this layered structure dries, the supported film 26 bonds to the arbitrary target substrate 28. The arbitrary target substrate 28 to which the supported film 26 is transferred can have a continuous or discontinuous structure (e.g., the substrate 28 can be in the form of a frame with internal voids/gaps).

Figure 6:
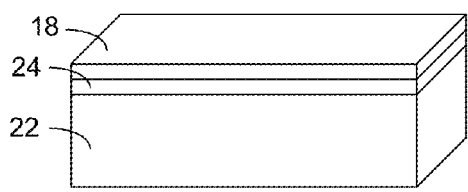
FIG. 6 is an illustration showing the h-BN film on the target substrate with the protective support layer removed.

The polymethylmethacrylate 20 is then removed by slowly flowing a solvent (e.g., a ketone, such as acetone) over it. The synthesized h-BN film 18 in the final structure 30, shown in FIG. 6, can include traces of polymethylmethacrylate on the h-BN surface from its earlier adhesion to the polymethylmethacrylate layer 20. Since the polymethylmethacrylate layer 20 is used only as support, any other polymer or material can be used for this purpose, provided that the support layer 20 can be removed when it is transferred to the target substrate 28.

After the transfer, the h-BN film 18 can be patterned via a lithography process, such as photolithography, electron-beam lithography or interference lithography. For example, the h-BN film 18 can be patterned via photolithography, and unwanted h-BN can be removed by alkaline molten salts or nitrides, such as LiOH, KOH, NaOH—$Na_2CO_3$, $NaNO_3$, $Li_3N$, $Mg_3N_2$, $Sr_3N_2$, $Ba_3N_2$ or $Li_3BN_2$. In other embodiments, the metal film 16 can be patterned by lithography before formation of the h-BN film 18 thereon. In additional embodiments, part of the metal surface can be protected with a covering to prevent h-BN growth thereon so that an h-BN pattern can be directly obtained.

In some embodiments, after the h-BN film 18 is transferred to the arbitrary target substrate 28 and/or after a particular pattern of h-BN is generated, particular areas of the h-BN film 18 are doped by one or more chemicals, such as sulfur, beryllium or carbon, to generate p- or n-type regions for devices. In additional embodiments, a certain area of the h-BN film 18 is intercalated with different molecules.

Exemplification:

300-nm-think nickel thin films were evaporated onto $Si/SiO_2$ substrates before the synthesis of h-BN. Then, the nickel-coated $Si/SiO_2$ substrates were placed in a quartz-tube chemical vapor deposition (CVD) chamber. The nickel was annealed at 900° C. for 30 minutes with 580 standard cubic centimeters per minute (sccm) nitrogen ($N_2$) and 500 sccm hydrogen ($H_2$) as protection gas. After thermal annealing, single crystalline nickel grain with atomically flat surfaces can be formed. The lateral dimensions of the nickel grain were about 20 μm.

The CVD growth was carried out after the temperature was cooled down from 900° C. to 400° C. When the desired temperature was reached, the flow rates of protection gases were adjusted to 100 sccm for $N_2$ and $H_2$, respectively. Then, 1-10 sccm flow of $N_2$ was supplied through a glass bubbler that contained 25 mL borazine. The temperature of the gas bubbler was maintained at 4° C. by a water chiller. The borazine vapor was carried out by the low flow rate of $N_2$ and mixed well with the protection gas before entering into the growth chamber. When borazine vapor reached the surface of nickel, a dehydrogenate reaction happened. This reaction was continued for 30 minutes to 1 hour, after which, the low flow rate of $N_2$ was turned off and the temperature was slowly increased to 1000° C. at a speed of 5° C./min. The as-grown h-BN film was annealed at 1000° C. for another 1 hour. Finally, the CVD furnace was turned off, and the CVD chamber was left to cool down to room temperature.

Once the CVD synthesis was completed, the h-BN films were transferred by coating the h-BN/Ni/$SiO_2$/Si substrates with a thin layer (with a thickness of about 100 nm) of polymethylmethacrylate (PMMA). After etching the underlying polycrystalline nickel with a nickel etchant (such as an aqueous hydrochloric acid solution), the PMMA/h-BN films detached from the Si/SiO$_2$ substrates and were transferred to de-ionized (DI) water and suspended on the surface of the water for removing the nickel etchant residuals. Subsequent to this separation from its underlying substrate, the h-BN film can be transferred to any arbitrary substrate, for example, a transmission-electron-microscope (TEM) grid for analysis and characterization, as described below. Finally, the top layer of PMMA was removed from the h-BN film by annealing the samples in N$_2$ and H$_2$ atmosphere at 450° C. for 40 minutes.

Figure 7:
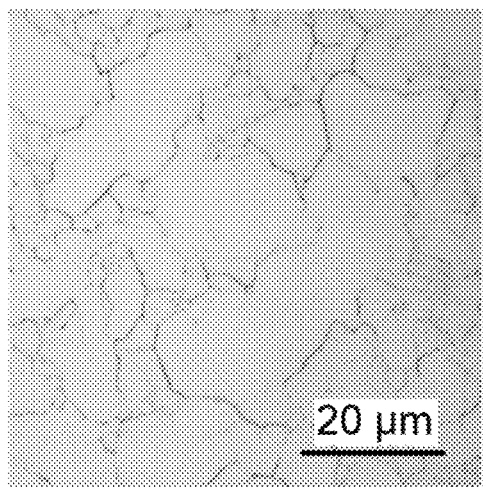
FIGS. 7-10 are optical images and AFM characterizations of fabricated h-BN thin films on nickel and on a $Si/SiO_2$ substrate.
Figure 8:
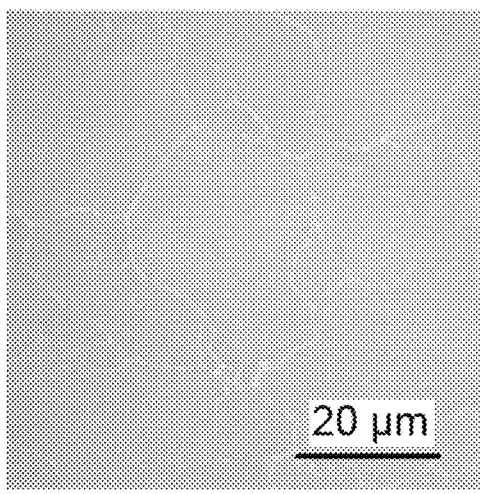

Optical images of an as-grown h-BN film and a h-BN film transferred to a Si/SiO$_2$ substrate are shown in FIGS. 7 and 8, respectively. FIG. 7 shows that the h-BN film continuously covers the whole area defined by the nickel film. The film thickness from one location to another is very consistent; only along the nickel grain boundary is there a thicker line shape of h-BN.

Figure 9:
Figure 10:
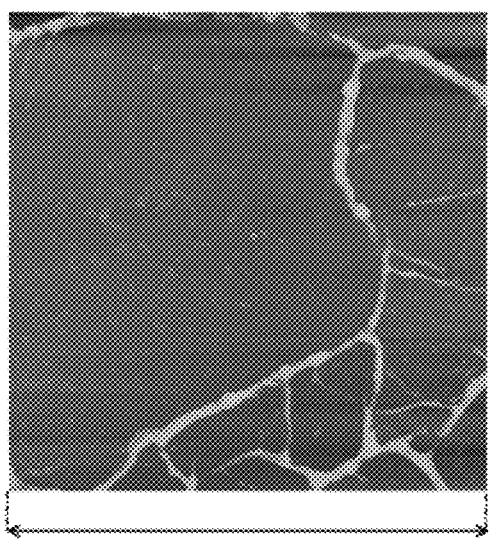
Figure 11:
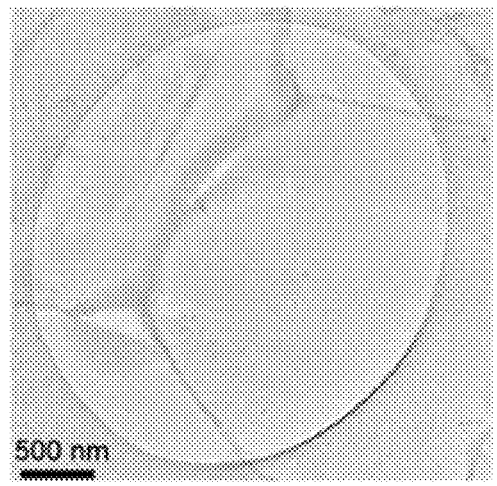
FIGS. 11-14 are TEM images and an electron beam diffraction pattern illustrating the fabricated h-BN films.

The surface morphology of the h-BN film was further characterized with atomic force microscopy (AFM). FIGS. 9 and 10, respectively, show AFM images of the as-grown h-BN film on the nickel surface and of the h-BN film transferred to a Si/SiO$_2$ substrate. The AFM images indicate that the obtained h-BN films have an atomic smooth surface. The thickness of h-BN obtained by 1 sccm borazine and 30 minutes growth was around 5 nm. A h-BN film with a thickness up to 50 nm can be obtained by increasing the flow rate of borazine to 10 sccm for 1 hour.

Figure 12:
Figure 13:
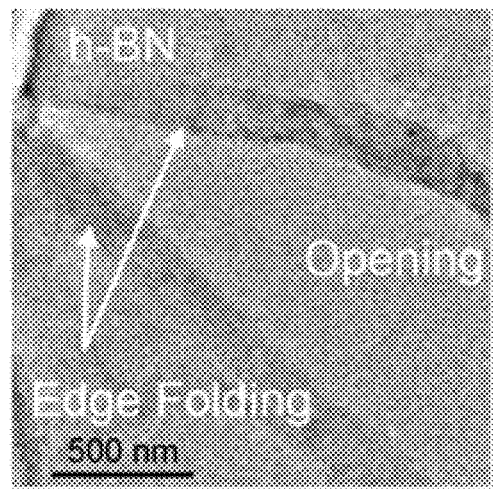

Transmission electron microscopy (TEM) was used to characterize the structure of the h-BN thin films, as shown in FIGS. 11-14. The CVD-grown films were transferred to Quantifoil Holey carbon grids, shown by the low-magnification TEM image in FIG. 11. The h-BN film tended to form wrinkles in the center of the grids, allowing us to confirm the successful transfer of the colorless thin film. An electron diffraction pattern was taken on the smooth region of the h-BN film to reveal the hexagonal lattice structure of the film, as shown in FIG. 12. The electron beam size was 50 nm, and the in-plane lattice constant can be estimated to be around 0.250±0.03 nm from the electron diffraction pattern. Over the entire h-BN film, only individual diffraction spots were obtained. Sometimes different diffraction patterns with secondary diffraction spots were observed due to the forming of wrinkles or the folding of layers.

Figure 14:
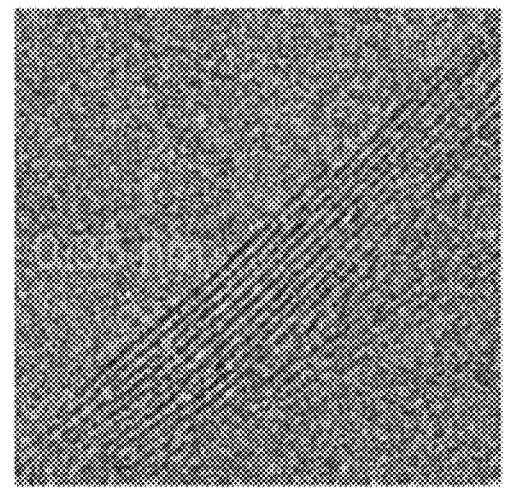

At some places, the h-BN film was broken and suspended across the TEM grids after the transfer process. A TEM image of the edge part of a broken h-BN film is shown in FIG. 14, which is a close-up TEM image taken on the surface of the h-BN film. This TEM image also shows a paralleled line shape feature of the film that may be due to the forming of small wrinkles on the surface or folding of layers, thus indicating the high quality crystalline structure and layer-by-layer growth of the h-BN film. From FIG. 14, the measured inter-layer distance is 0.35 nm. These TEM characterizations of the thin h-BN film reveal the single crystalline nature of the examined areas and indicate the high quality of these synthesized h-BN thin films.

Figure 15:
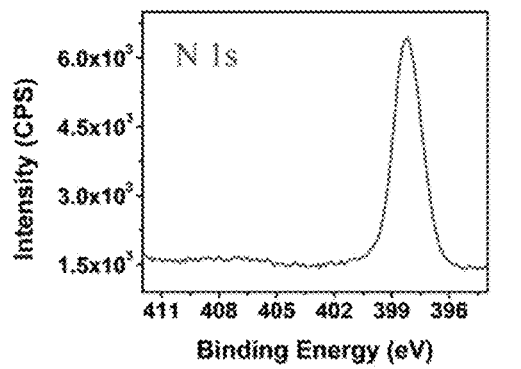
FIGS. 15-17 present XPS spectra characterization of a fabricated h-BN film on a nickel substrate.
Figure 16:
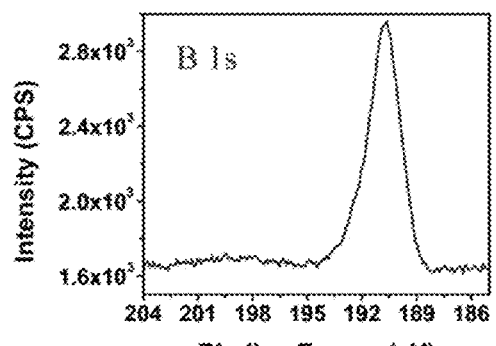
Figure 17:
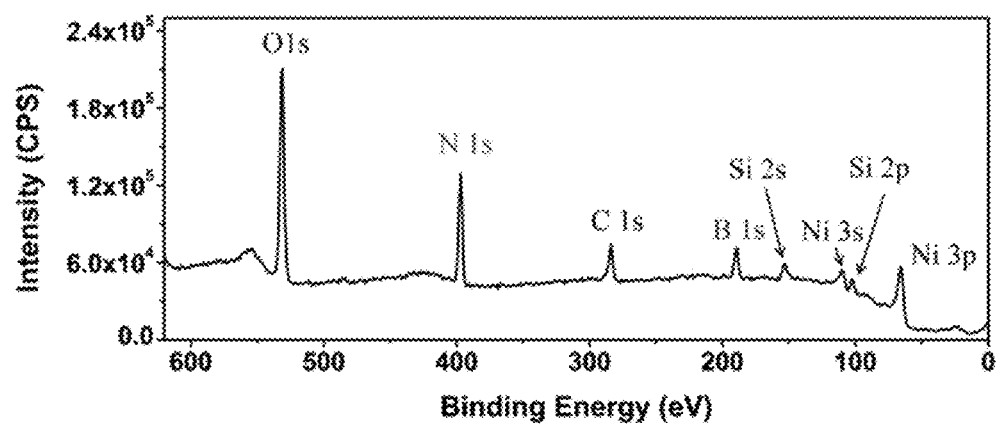

X-ray photoelectron spectroscopy (XPS) was also used to characterize the synthesized h-BN thin films. FIGS. 15-17 show the XPS spectra of an as-grown h-BN thin film on a nickel substrate. The atomic concentration analysis for B/N was 52.93% and 47.07% respectively. The binding energy for N 1s and B 1s are respectively shown in FIGS. 15 and 16.

Figure 18:
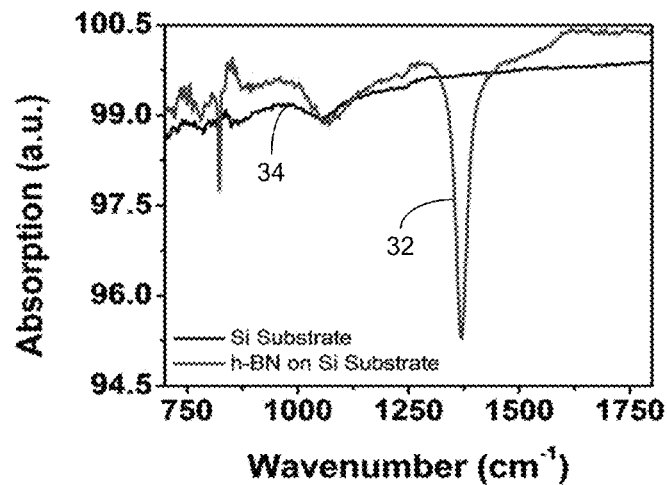
FIG. 18 presents the FTIR spectra of a fabricated h-BN film on a $Si/SiO_2$ substrate.
Figure 19:
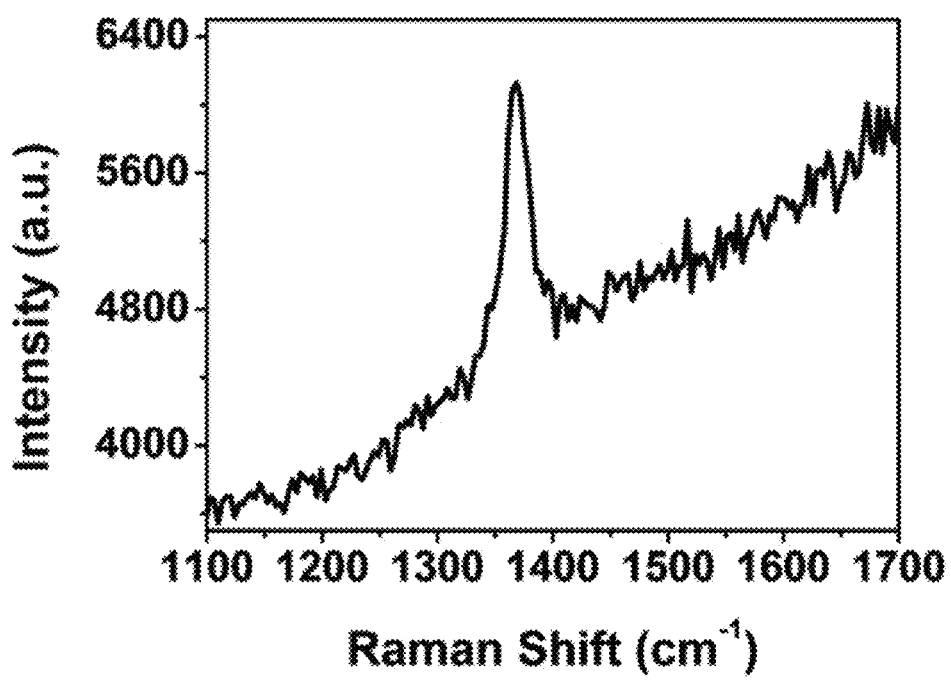
FIG. 19 presents the Raman spectra of the fabricated h-BN film on the $Si/SiO_2$ substrate.

Fourier transform infrared (FTIR) and Raman spectroscopy were also used to analyze the h-BN thin films that were transferred to silicon and SiO$_2$/Si substrates. FIGS. 18 and 19, respectively, are the FTIR and Raman spectra of a h-BN film with a thickness of about 50 nm. The laser wavelength used for Raman spectroscopy was 532 nm. FIG. 18 shows the FTIR spectra of the synthesized h-BN films on silicon substrates, wherein the spectra of h-BN is shown with plot 32, and the spectra of the silicon is shown with plot 34. The strong absorption band centered at 1369.5 cm$^{-1}$ is assigned to the in-plane ring vibration. The peak centered around 822.8 cm$^{-1}$ is characteristic of the out-of-plane h-BN vibration. The Raman spectrum in FIG. 19 shows a peak at 1367.8 cm$^{-1}$, which can be attributed to the $E_{2g}$ vibration mode of h-BN.

Figure 20:
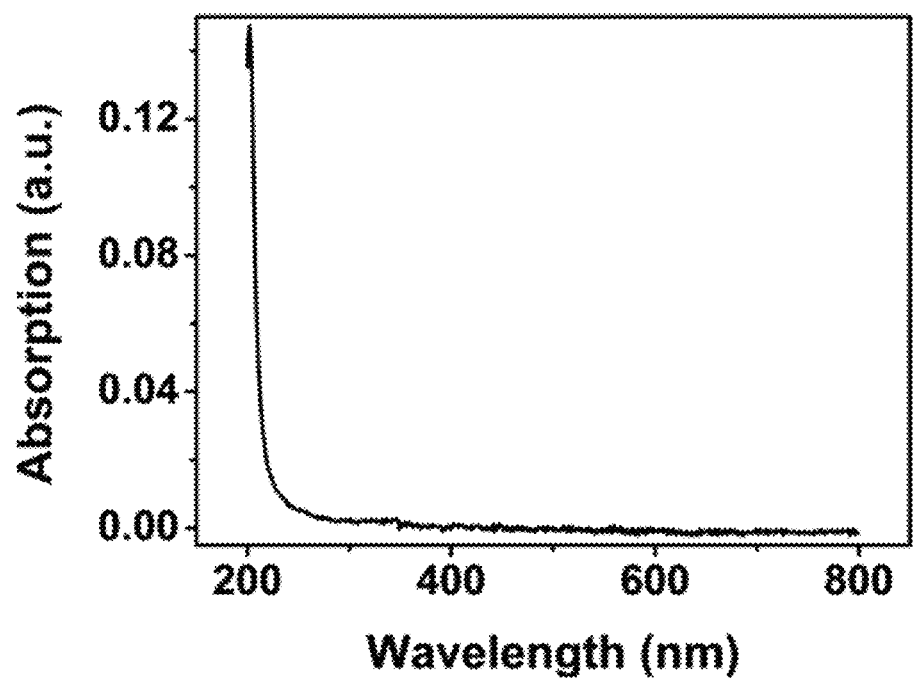
FIG. 20 presents the photo-absorption spectra of a fabricated h-BN film on a quartz substrate.
Figure 21:
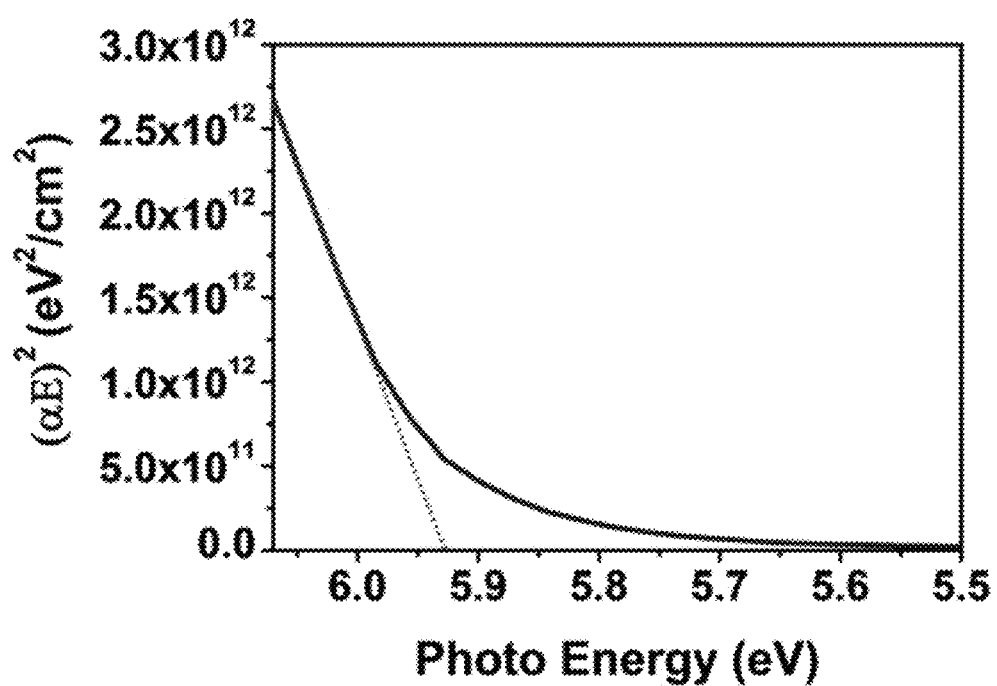
FIG. 21 presents the result of an optical-band-gap analysis on the fabricated h-BN film on a quartz substrate.

Optical absorption spectra of the h-BN thin film are presented in FIG. 20; and based on the absorption spectra, the optical band gap ($E_g$) can be extracted and is shown as the solid line in FIG. 21. An h-BN film with a thickness of about 5 nm was transferred to a quartz substrate for characterization. The $E_g$ value was estimated to be 5.92 eV, which suggests that the h-BN thin film had a large band gap.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by $1/100^{th}$, $1/50^{th}$, $1/20^{th}$, $1/10^{th}$, $1/5^{th}$, $1/3^{rd}$, $1/2$, $3/4^{th}$, etc. (or up by a factor of 2, 5, 10, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references optionally may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for fabricating a hexagonal boron nitride film, comprising:
    providing a growth substrate including a metal surface;
    growing a hexagonal boron nitride film on the metal surface;
    annealing the hexagonal boron nitride film;
    coating the hexagonal boron nitride film with a protective support layer; and releasing the whole hexagonal boron nitride film together with the protective support layer from the metal surface.

2. The method of claim 1, wherein the hexagonal boron nitride film is deposited on the metal surface via chemical vapor deposition at a temperature less than 400° C.

3. The method of claim 2, wherein the chemical vapor deposition is carried out at ambient pressure.

4. The method of claim 2, wherein the chemical vapor deposition is carried out at a pressure of at least about 50 kPa.

5. The method of claim 1, wherein the hexagonal boron nitride film is annealed at a temperature in a range from about 900° C. to about 1100° C.

6. The method of claim 1, further comprising applying the hexagonal boron nitride film and the protective support layer coating to a target substrate.

7. The method of claim 6, further comprising removing the protective support layer from the hexagonal boron nitride film after application to the target substrate.

8. The method of claim 7, further comprising doping at least one region of the hexagonal boron nitride film to produce at least one p- or n-type region for a device.

9. The method of claim 7, further comprising intercalating at least one other type of molecule into the hexagonal boron nitride film.

10. The method of claim 1, wherein the metal surface comprises at least one of nickel, platinum, copper, ruthenium, iron, cobalt, and molybdenum.

11. The method of claim 10, wherein the metal surface comprises nickel.

12. The method of claim 10, wherein the growth substrate comprises silicon with a silica surface coating, and wherein the metal surface is formed over the silica surface coating.

13. The method of claim 10, further comprising providing the metal surface on the growth substrate via a deposition method selected from evaporation, sputtering and electrochemical deposition.

14. The method of claim 13, further comprising patterning the metal surface via lithography.

15. The method of claim 1, wherein the hexagonal boron nitride film is deposited on the metal surface via chemical vapor deposition using a precursor selected from at least one of borazine and B-trichloroborazine ($(ClBNH)_3$).

16. The method of claim 15, wherein the precursor is borazine and the hexagonal boron nitride film is formed when the borazine contacts the metal surface at a temperature of about 400° C. and dehydrogenates.

17. The method of claim 15, further comprising annealing the hexagonal boron nitride film at or above 1000° C. on the metal surface.

18. The method of claim 1, wherein the protective support layer comprises at least one of polymethylmethacrylate, polydimethylsiloxane, polyethylene terephthalate, and polyethylene naphthalate.

19. The method of claim 1, wherein the metal surface is etched to release the hexagonal boron nitride film and the protective support layer.

20. The method of claim 19, wherein the hexagonal boron nitride film has a thickness of 1 nm to 50 nm and covers an area of at least about 1 $cm^2$.

* * * * *